United States Patent [19]

Wang et al.

[11] Patent Number: 5,299,013
[45] Date of Patent: Mar. 29, 1994

[54] SILICON BUTTING CONTACT IMAGE SENSOR WITH TWO-PHASE SHIFT REGISTER

[75] Inventors: Weng-Lyang Wang; Way-Chen Wu, both of Saratoga; Long-Ching Yeh, Sunnyvale, all of Calif.

[73] Assignee: Dyna Image Corp., Milpitas, Calif.

[21] Appl. No.: 90,569

[22] Filed: Jul. 13, 1993

Related U.S. Application Data

[63] Continuation of Ser. No. 735,540, Jul. 25, 1991, abandoned.

[51] Int. Cl.[5] .................. H04N 3/14; H04N 5/335
[52] U.S. Cl. .................................. 348/307; 358/482; 348/308
[58] Field of Search ............... 358/213.29, 213.23, 358/213.31, 213.11, 213.27; 250/578.1, 208.1; 257/248, 234

[56] References Cited

U.S. PATENT DOCUMENTS

| | | | |
|---|---|---|---|
| 3,845,295 | 10/1974 | Williams et al. | 358/213.29 |
| 4,405,857 | 9/1983 | Hirai et al. | 358/213.11 |
| 4,575,638 | 3/1986 | Okumura | 358/213.29 |
| 4,589,026 | 5/1986 | Ozawa et al. | 358/213.29 |
| 4,644,411 | 2/1987 | Sato et al. | 250/208.1 |
| 4,668,971 | 5/1987 | Hynecek | 357/24 M |
| 4,672,453 | 6/1987 | Sakamoto | 358/213.23 |
| 4,977,304 | 12/1990 | Ino et al. | 250/208.1 |
| 5,060,071 | 10/1991 | Ino | 358/213.11 |

Primary Examiner—Joseph Mancuso
Assistant Examiner—Wendy R. Greening
Attorney, Agent, or Firm—Townsend and Townsend Khourie and Crew

[57] ABSTRACT

An improved contact image sensor (CIS) which uses a two-phase shift register is disclosed. The shift register is clocked by both phases of the clock signal, thereby doubling its speed. A transmission gate in the shift register is eliminated and combined with one of the inverters to allow two-phase operation and reduce the number of transistors required to implement the shift register.

17 Claims, 15 Drawing Sheets

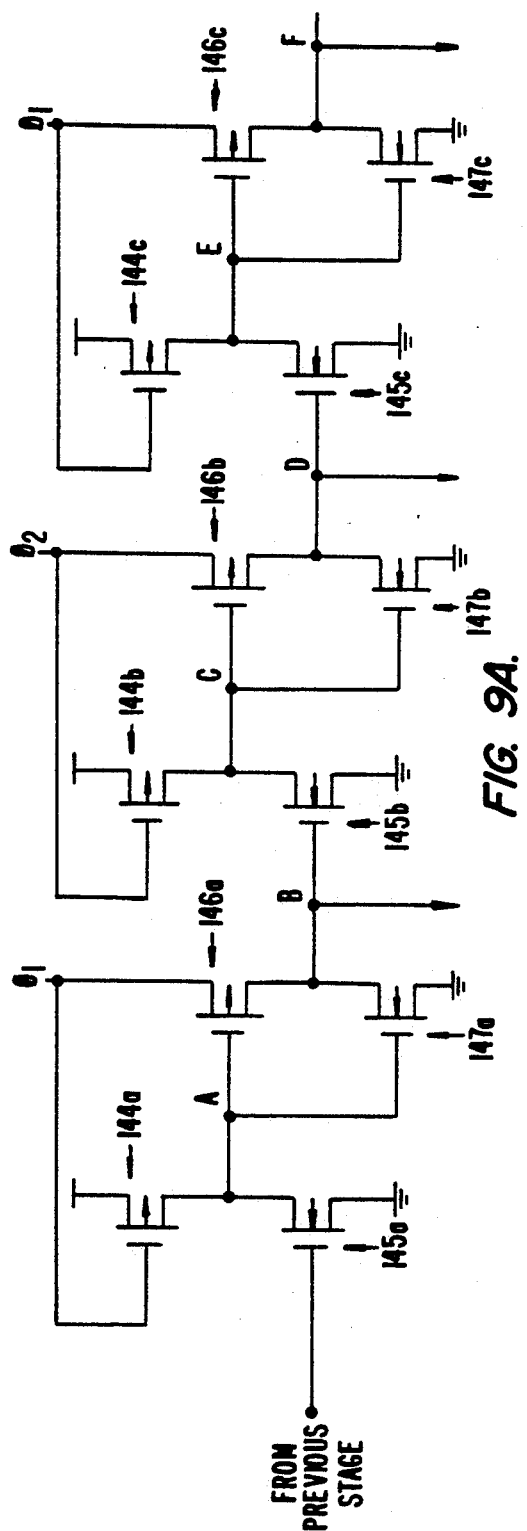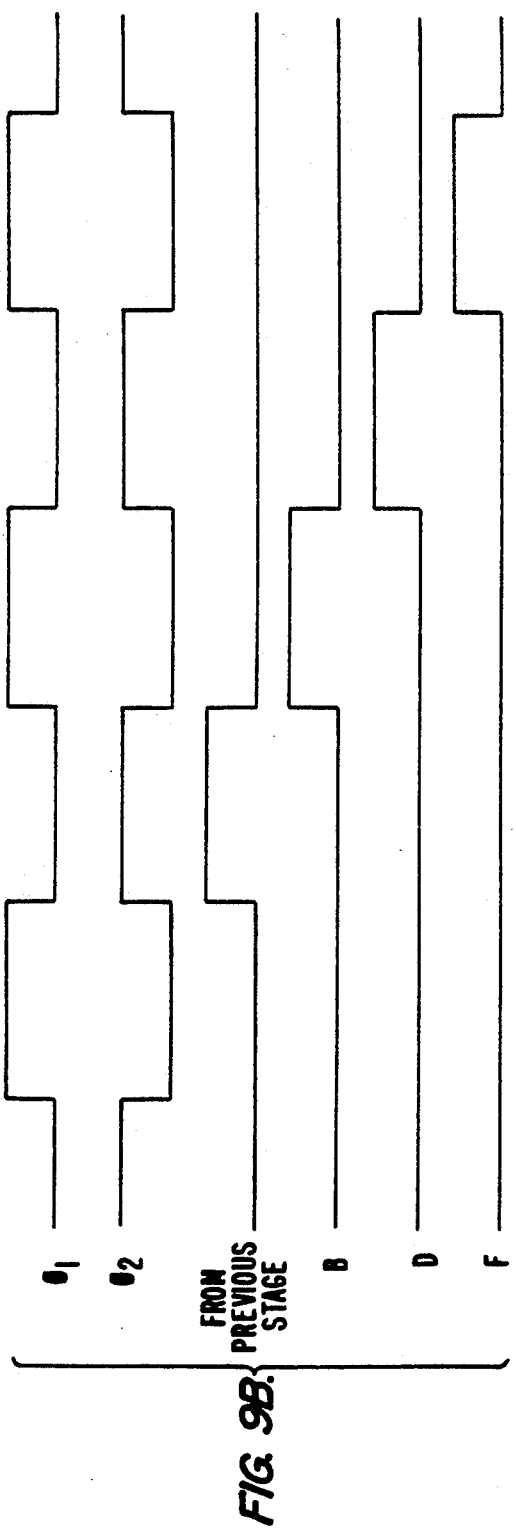
FIG. 9A.
FIG. 9B.

SILICON BUTTING CONTACT IMAGE SENSOR WITH TWO-PHASE SHIFT REGISTER

This is a continuation of application Ser. No. 07/735,540 filed Jul. 25, 1991, now abandoned.

BACKGROUND

The present invention relates to contact image sensors for digitizing images on a paper.

Image sensors are used in a number of applications, such as photocopiers, facsimile machines, optical character readers, and scanners. One type of system uses a self-scan photodiode array with good uniformity of the pixels, but limited gain. Such a system is used, for instance, by Hitachi in its camcorder.

Another technology used for image sensors is the charge injection device (CID). These operate similarly to the self-scan photodiode arrays, but charge is injected into the substrate by the light, which is then read out.

Another type of technology used is the charge coupled device (CCD) array. CCDs have been widely used in fax and scanner applications for a long time. Since the presently achievable length of a charge coupled device is about 1 inch, for an A4 paper of 8.5 inch width, a concave lens is needed to focus the images on the paper to the CCD sensors. This results in a bulky module because the CCD array must be placed several inches behind the paper. Moreover, for a flat-bed scanner application, since the whole module is required to scan over the full length of the paper, the module needs to be moved by a high power stepper motor, which suffers from a non-smooth movement that causes distortion.

In addition, by using a single CCD chip for the fax or scanner applications, only 300 DPI resolution can be achieved for the A4 size paper. For higher resolution, the charge transfer efficiency will be degraded even more, since a smaller sensor area is required. Moreover, by decreasing the sensor area (typical size is about 11 $\mu m \times 11$ $\mu m$), the sensitivity of the sensor, which is proportional to the size of the area, is also degraded. This always results in a longer time to scan over the document (several seconds for A4 size document).

FIG. 1 is a diagram of a contact image sensor (CIS) module 10 which uses a self-scanned photodiode array 12. Such a system is manufactured by Mitsubishi. A light emitting diode (LED) array 14 reflects light off an image on a paper 16 through glass 18 to rod lens array 20 which provides the reflected light to photodiode array 12.

FIG. 2 shows a top view of a portion of this module with LED array 14 and rod lens array 20 visible. As can be seen, the rod lens array is composed of a line of individual glass rods 22. Each rod of the rod lens will cover approximately 16 photodetectors and will direct the reflected light it receives down to those photodetectors. The rod lens serves to focus the light on the photodetectors. The rod lens will not cause a mirror image to be presented like a typical rounded lens. The rod lens array is used rather than simply placing the photodetectors closer to the paper because a rod lens array provides better image quality.

FIG. 3 is a block diagram of the electronic circuitry in CIS module 10 of FIG. 1. LED 14 and rod lens array 20 are shown. Sensor array 12 is also shown, composed of any number of individual sensors 24. These are shown connected to a shift register and analog switches 26. The shift register functions to sequentially enable each analog switch in series to connect each of the individual sensors 24 in series to an amplifier 28. The output of the amplifier provides the pixel signals corresponding to each sensor in series.

The shift register in FIG. 3 propogates a single "1" value which connects each of the sensors in sequence to the amplifier. This is in contrast to a shift register used with a CCD array, which has the entire contents of the CCD array downloaded into it, and then shifts the data out. One such shift register using two clock phases is shown in U.S. Pat. No. 4,194,213. Another device where the two phase shift register is an integral part of the memory itself is shown in U.S. Pat. No. 4,720,815.

SUMMARY OF THE INVENTION

The present invention provides an improved contact image sensor (CIS) which uses a two-phase shift register. The shift register is clocked by both phases of the clock signal, thereby doubling its speed. A transmission gate in the shift register is eliminated and combined with one of the inverters to allow two-phase operation and reduce the number of transistors required to implement the shift register.

The present invention also provides a charge integrator in place of the voltage amplifier of the prior art to provide an amplified version of the sensor outputs. The integrator circuit will operate faster and generate less noise than a voltage amplifier.

The spacing between photo sensors at the junction between abutting chips is made consistent with the spacing between sensors on a single chip. This is done by making the edge sensor narrower and by eliminating a portion of the collector of the edge sensor transistor.

A color version of the sensor is also provided with three rows of photodetectors for the different colors. These three rows are connected to three different output lines for the three color values. The shift register enables three analog switches in parallel connected to the three output lines.

For a fuller understanding of the nature and advantages of the invention, reference should be made to the ensuing detailed description taken in conjunction with the accompanying drawings.

BRIEF DESCRIPTION OF THE DRAWINGS

FIGS. 9A and 9B are circuit and timing diagrams of a third embodiment of a shift register according to the present invention;

DETAILED DESCRIPTION OF THE PREFERRED EMBODIMENTS

Figure 4:
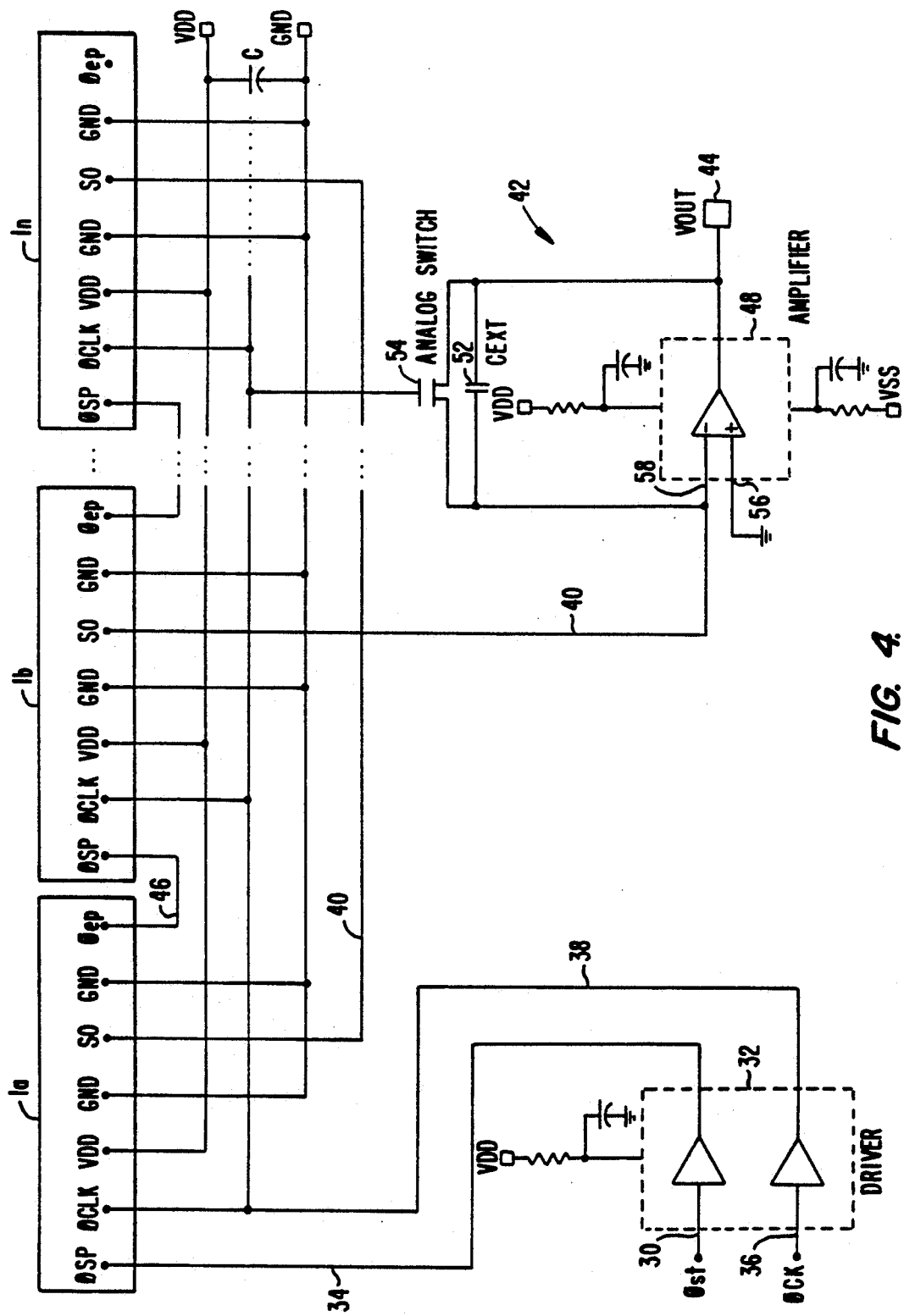
FIG. 4 is a simplified circuit diagram of a contact image sensor according to the present invention.

FIG. 4 shows a series of self-scanned photodiode array chips 1A, 1B through 1N. Each photodiode array chip 1N has 128 photodetectors, providing 128 pixel diodes per chip. The number of chips will depend upon the application. For instance, for A6, A4 and B4 paper sizes, 13, 27 and 32 chips are needed, respectively. The value of each of the photodetectors in a chip is read out sequentially. The readout is initiated by a start pulse, $\phi$ST on an input 30 to the circuit board. Input 30 is provided through a driver 32 on a line 34 to the start pulse input, $\phi$SP of photodiode array chip 1A. This starts the readout. A clock pulse $\phi$CK on an input line 36 is provided through driver 32 on a line 38 to the clock input of all of the chips. The output of chip 1A, labeled SO, is provided on a line 40 to an integrator circuit 42. Integrator circuit 42 amplifies the output and provides it on an output pad 44.

All of the pixel values from chip 1A are read out in series, and when it is completed an end pulse will o be provided on the $\phi$EP output of chip 1A on a line 46 to the $\phi$SP input of chip 1B. The process then continues with the 128 photodiodes of chip 1B read out in series. This process continues until all of the 1N array chips are read out. When this is done, the array is ready to start over for the next line to be read.

Integrator circuit 42 improves over the amplifiers of the prior art by providing a faster response with less noise. The integrator includes an amplifier 48, a capacitor 52, and an analog switch 54. The non-inverting input 56 of the amplifier 48 is grounded, which means that the inverting input 58 will be held at virtual ground. When the current from a particular photodiode is being read out from line 40, analog switch 54 is turned off and the same amount of current is induced across integration capacitor 52. This voltage level is thus presented at the output 44 to be read by the external circuitry. When the photodiode is disconnected in response to the clock signal, so that current is no longer flowing along line 40, analog switch 54 is activated. The clock signal and its inverse are actually used, with switch 54 being activated by one phase for odd pixels, and the other phase for even pixels. This shorts out capacitor 52, causing it to discharge and be reset to virtual ground for the next photodiode. The output voltage will thus correspond to the amount of current from each photodiode. The amount of current from each photodiode is in turn proportional to the amount of light it detects.

The response time of integrator 42 is in the range of a few nanoseconds (ns), compared to the response time of a few hundred ns of a typical amplifier of the prior art. Integrator 42 is also less susceptible to noise because reset capacitor 52 is small. Therefore, reset noise is smaller for integrator 42 than for a voltage amplifier.

Figure 5:
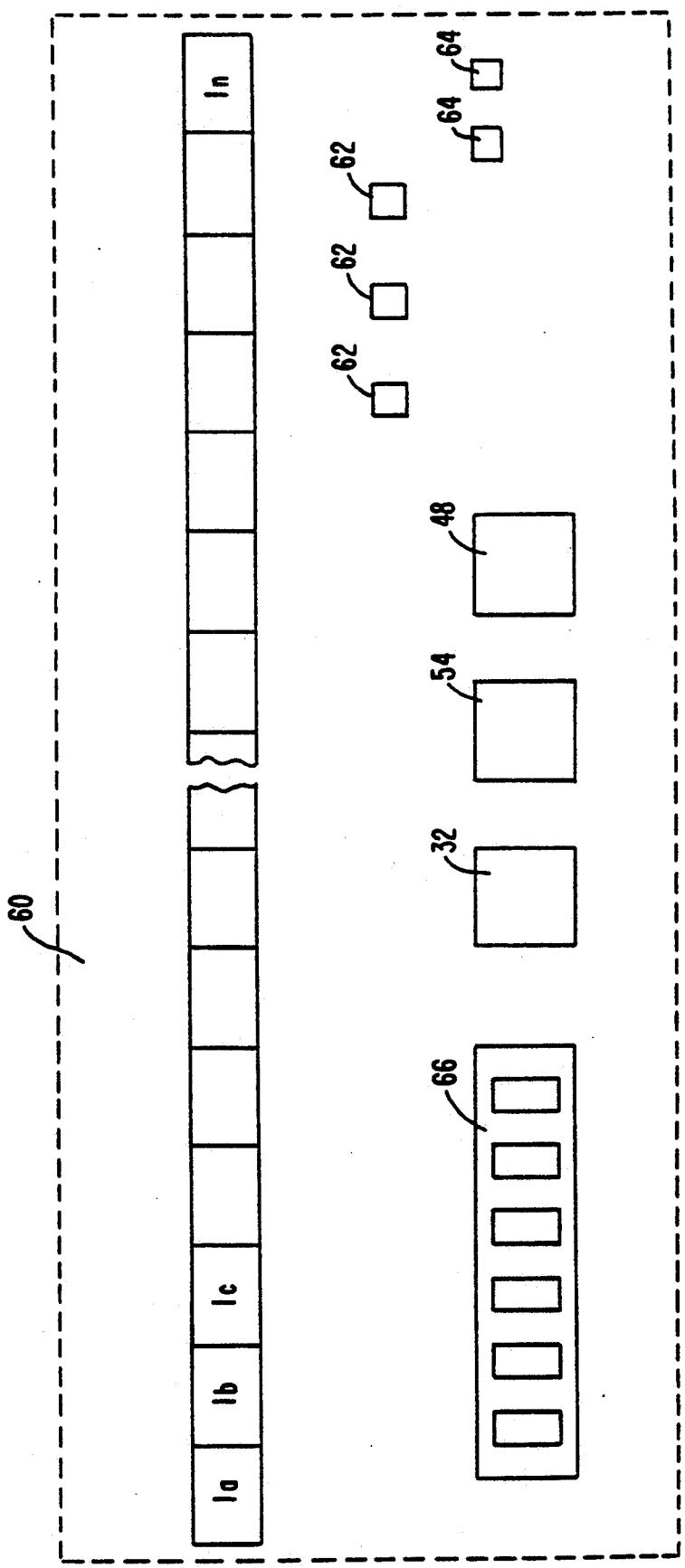
FIG. 5 is a top view of a contact image sensor circuit board with the circuit of FIG. 4.

FIG. 5 shows the physical layout of a circuit board according to the present invention. The photodetector array chips 1A, 1B, 1C . . . 1N are mounted butting up against one another. Each chip size is 8013 $\mu$m $\times$ 700 $\mu$m. The photodetector to photodetector spacing on each chip is 2.5 mil, giving a resolution of 400 dots per inch (DPI). This spacing is maintained between the last photodetector on a first chip and the first photodetector on the next chip by the unique features of the present invention described below with respect to FIGS. 10 and 11. The array chips are mounted on printed ceramic substrate 60. The ceramic substrate has thick-film conductive and dielectric layers printed on the top of the bare ceramic substrate to provide the connections between the various elements on the board. The board also contains a number of resistor chips 62, capacitor chips 64, and power supply circuit chips 66. Also shown are the driver circuit 32, analog switch 54, and current amplifier 48.

Figure 6:
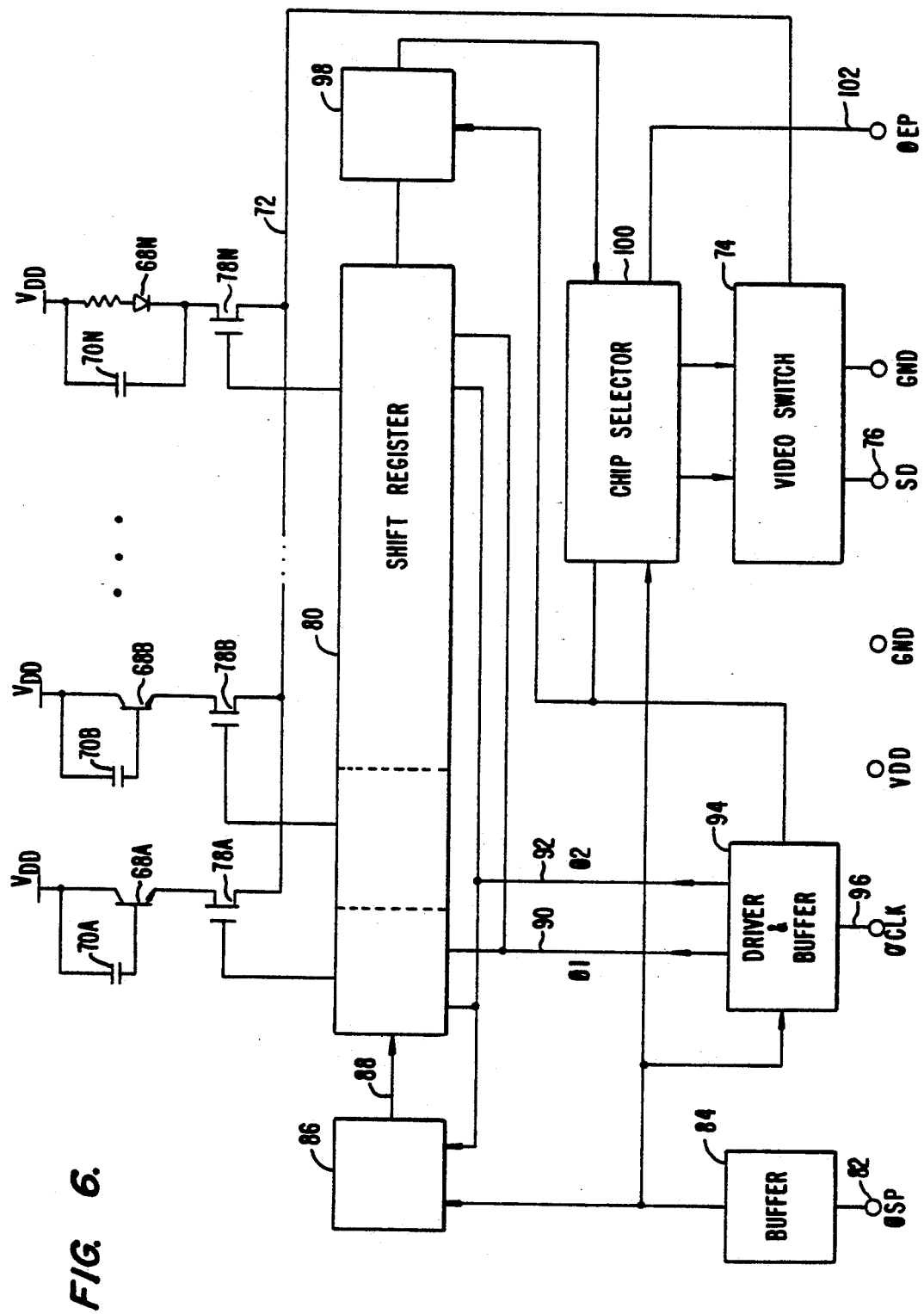
FIG. 6 is a simplified circuit diagram of a photodiode array chip of FIG. 5.

FIG. 6 is a circuit diagram of a photo array chip 1N of FIG. 4. An array of phototransistors 68A, 68B, etc., are shown. The last one shown, 68N is a photodiode. The photodiode is shown as an example of an alternate structure for the photo sensitive element. Each of the phototransistors of the photo array has a capacitor 70A, 70B, . . . 70N connected to it. These individual capacitors will charge up if their associated phototransistor is exposed to light. To read these values, the capacitors are discharged to a read line 72 which is provided through a video switch 74 to the SO output 76.

Each individual phototransistor is coupled to read line 72 through a switch 78A, 78B, . . . 78N, respectively. Each switch is activated in turn by a shift register 80. The shift register is started by a start pulse on input 82 which is received from either an external device, for the first photo array, or from the previous photo array. The signal is provided through a buffer 84 to a dummy shift cell 86. Dummy cell 86 is provided to isolate the first cell of the shift register from the edge effects at the edge of a chip. The start pulse is provided from cell 86 on line 88 to the first cell of shift register 80, and then sequences through all the cells of the shift register, being clocked by two clock phases provided on lines 90 and 92 from a driver and buffer circuit 94. Circuit 94 receives the external clock on line 96 and produces the two phases to the shift register and other circuitry. As the pulse passes through the shift register, it activates each switch 78A, 78B, etc., in turn. At the end of the shift register, it will be provided to a cell 98, which is also provided to eliminate edge effects. Cell 98 will provide the signal to a chip selector circuit 100.

Chip selector 100 will perform two functions. First, it will shut off video switch 74, isolating read line 72 from output line 76. This is important because line 76 is commonly connected to all of the photo array chips, and only one of the photo arrays can be outputting at one time. Second, chip selector 100 provides an end pulse on line 102 to an output of the chip. This end pulse will be connected to the next photo array chip's input start pulse pin.

When the start pulse is received from the previous chip through buffer 84, this signal is also provided to chip selector 100. This turns on the video switch 74, providing this chip's output to the common output line. Thus, the previous chip's video switch will be turned off and the next chip's video switch will be turned on. The start pulse is also connected to the clock divider and buffer chip 94 to start the provision of the two-phase clocks to the elements of the chip.

The charge buildup on each phototransistor cell is determined by the amount of time between successive output scans of that cell. For the array of chips, this will be the time in-between start pulses provided to the circuit board.

Initially, each capacitor will be charged up due to the voltage VDD applied to the capacitor. The charge on each capacitor will be gradually removed by the reverse current flowing on the associated phototransistor. The reverse current consists of two components; the photo-current and the dark leakage current (which can normally be neglected). The photo-current is the product of a photodetector responsivity and the light intensity. Thus, the greater the light detected, the greater the photo-current and the more the capacitor will be discharged. Thus, when the cell is read, if it has been dark above the cell, the capacitor will be fully charged, and if it has been brightly lit, the capacitor will be substantially discharged. When the value of the capacitor is read out by activating the appropriate switch, the capacitor will be recharged during the read out. Since, during read out, the emitter of the transistor is effectively connected to ground, and current will flow through the transistor into the base. The current flowing to the base will recharge the capacitor. Thus, the current is both read out and the capacitor is reset simultaneously.

If too long a time passes between successive reads, the dark leakage current could discharge the capacitor. When a long interval has passed, the array can be reset by doing a dummy read to charge all the capacitors.

Figure 7A:
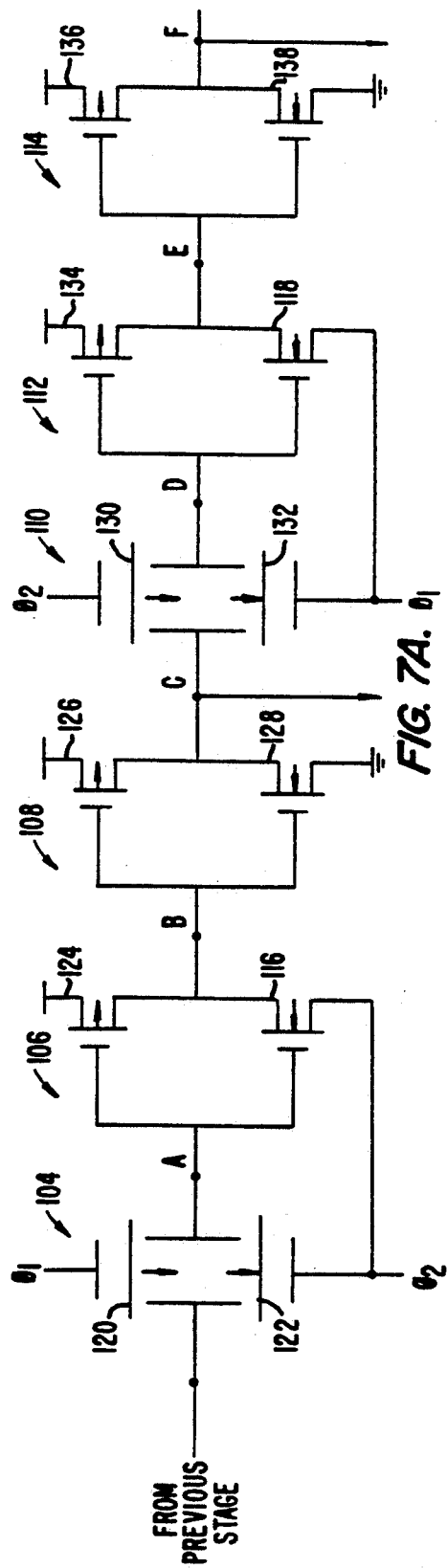
FIGS. 7A and 7B are circuit and timing diagrams for a first embodiment of a two-phase shift register according to the present invention.
Figures 8A, 8B:
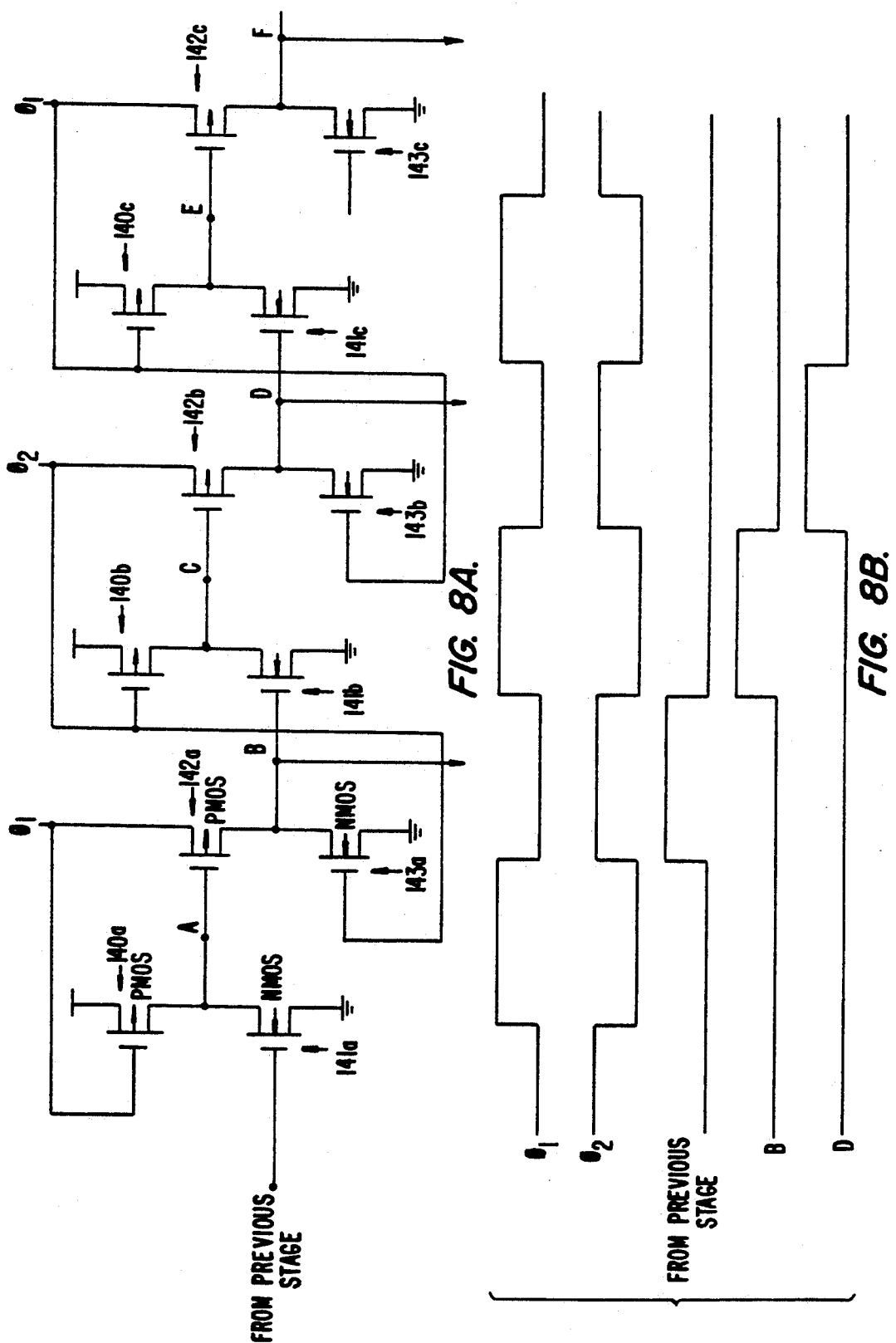
FIGS. 8A and 8B are circuit and timing diagrams of a second embodiment of a two-phase shift register according to the present invention.

FIGS. 7A, 8A and 9A show three different embodiments of a two-phase shift register used for shift register 80 of FIG. 6. A typical shift register stage consists of two inverters in sequence with transmission gates between each inverter. The shift register of FIG. 7A uses one transmission gate and two inverters for each stage. Two stages are shown in the circuit of FIG. 7A. The first stage has a transmission gate 104 and two inverters 106 and 108. The second stage, between nodes C and F, has a transmission gate 110 and two inverters 112 and 114. The second inverter, 108 and 114, respectively, in each stage is the same. However, the first inverter in each stage, 106 and 112, respectively, has a transistor, 116 and 118, respectively, with its drain connected to the clock signal. The odd and even register stages alternate between being connected to the $\phi 1$ and $\phi 2$ clocks, respectively.

Transmission gate 104 consists of transmission switches 120 and 122. Inverter 106 consists of transistors 116 and 124. Inverter 108 consists of transistors 126 and 128. Transmission gate 110 consists of transmission switches 130 and 132. Inverter 112 consists of transistor 118 and transistor 134. Inverter 114 consists of transistors 136 and 138.

The arrows connected to nodes C and F indicate the outputs which are connected to the photosensor switches 78n of FIG. 6.

Figure 7B:
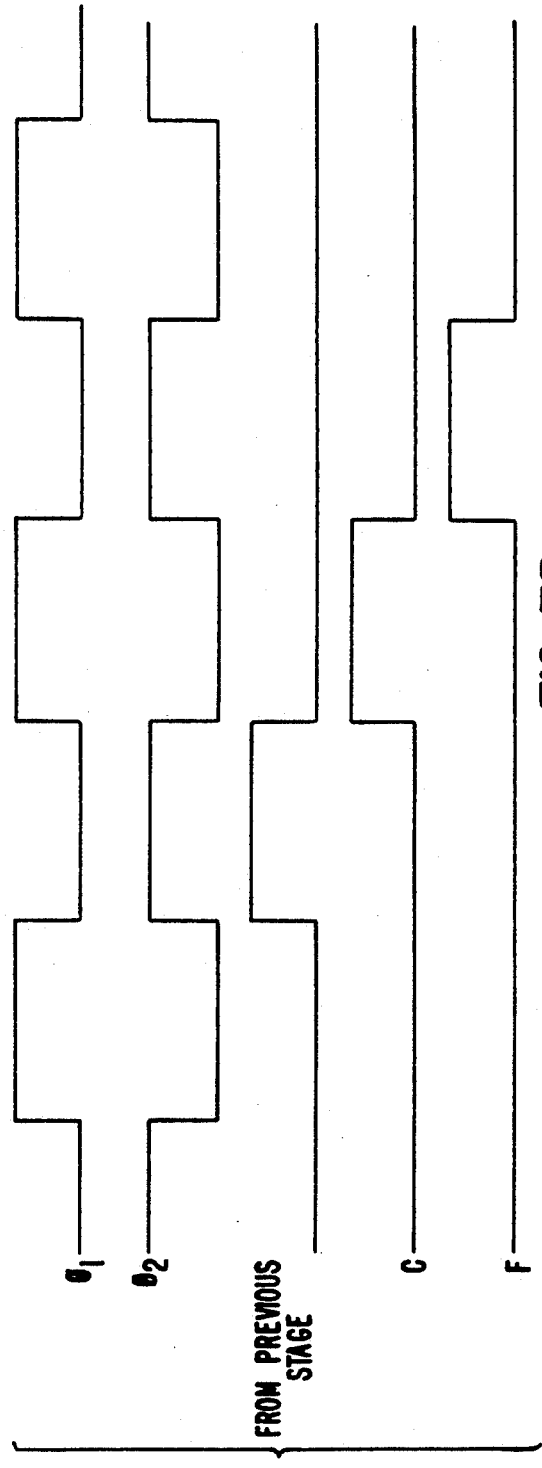

FIG. 7B is a timing diagram illustrating the timing for the shift register of FIG. 7A. The two-phase of clocks, $\phi 1$ and $\phi 2$ are shown. Also shown is a pulse coming from the previous stage, and that pulse being transmitted to nodes C and F at the end of the two stages of FIG. 7A on each half clock cycle. As can be seen, the pulse proceeds through two shift register stages during a single clock cycle.

As can be seen, the pulse passes from the previous stage to node C when clock $\phi 2$ is low. This low half of clock $\phi 2$ is applied to the drain of transistor 116, thereby activating this inverter stage. The clock is thus used to connect this drain to ground rather than having a permanent connection to ground as in inverter 108, for instance. The other phase of the clock, $\phi 1$, is used for the next stage because during the second half of the clock cycle, $\phi 2$ is high and would not serve this purpose. By using the two phases, one clock and then the other is low in each half cycle, thus permitting alternating inverters in alternate stages to be clocked.

A second embodiment of a two-phase shift register is shown in FIG. 8A. Instead of 6 transistors per stage as in the previous shift register of FIG. 7A, it only requires 4 transistors per stage. The four CMOS transistor structure will increase the array yield. Each stage (a, b and c) consists of two PMOS transistors (140a, 142a; 140b, 142b; or 140c, 142c) and two NMOS transistors (141a, 143a; 141b, 143b; or 141c, 143c). The timing diagram of the FIG. 8A shift register is shown in FIG. 8B. In the device design, the W/L ratio of NMOS transistors 141a, 141b, 141c is 10 times larger than that of the PMOS transistors 140a, 140b, 140c. Therefore, when both of the transistors are turned on, the voltage of points "A", "C" and "E" are low. Point "A" will be pulled low since the W/L ratio of transistor 141a is 10 times larger than that of transistor 140a. This means that the resistance across transistor 141a is much lower, putting node "A" much closer to ground than to the high voltage level on the other side of transistor 140a. The low voltage will turn the PMOS transistors 142a, 142b, 142c on when clock $\phi 1$ is high.

The outputs of the three stages of FIG. 8A are at points B, D and F. The arrows connected to nodes B, D and F indicate the outputs which are connected to the photosensor switches 78n of FIG. 6. As can be seen from the timing diagram in FIG. 8B, when a pulse from the previous stage is applied to transistor 141a $\phi 1$ is low. When both 141a and 140a are on, point "A" will be low. As $\phi 1$ switches to high, point "A" will stay low, turning on transistor 142a and pulling up point "B" to the high level of $\phi 1$.

As can be seen, the subsequent stages of the shift register operate in the same way. In the next stage however, clock signal $\phi 2$ is used so that the transition through this stage can be done in the next half clock cycle, rather than waiting for the next high level of clock $\phi 1$.

FIG. 9A shows a shift register similar to that of FIG. 8A. In the FIG. 9A embodiment, however, the gate of transistor 147a is coupled to node A, rather than to the phase 2 clock as in FIG. 8A. Similarly, the gate of transistor 147b is coupled to node C. This modification of the circuitry of FIG. 8A is intended to simplify device layout and reduce clock coupling problems. Otherwise, the circuit operates in the same manner as that of FIG. 8A. The timing diagram for the circuit of FIG. 9A is shown in FIG. 9B. The transistors in the first stage of FIG. 9A, transistors 144a, 145a, 146a and 147a correspond to 140a, 141a, 142a and 143a of FIG. 8A. Similarly, the next two stages correspond in a like manner.

Figure 10:
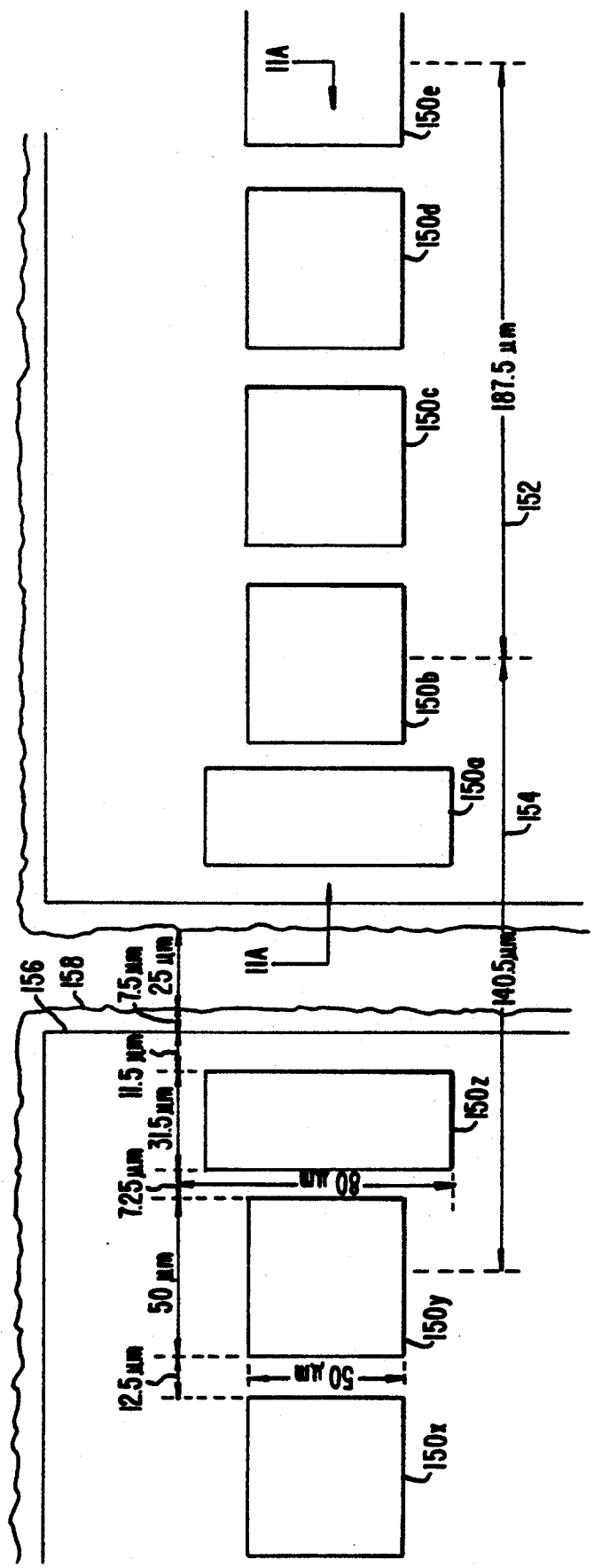
FIG. 10 is a top, enlarged view of the abutting portions of two array chips according to the present invention.

FIG. 10 shows an enlarged view of a portion of two chips butting up against each other. A number of phototransistors 150x, 150y, 150z, 150a, 150b, 150c, 150d, and 150e are shown. All the phototransistors are the same size of 50 μm by 50 μm. The last photodetector in a chip, 150Z, and the first photodetector in the next chip, 150A, are narrower and longer, with dimensions of 31.5 μm by 80.5 μm. In addition, phototransistor 150Z is closer to 150Y than 150Y is to 150X. A typical spacing between phototransistors is 12.5 μm, except that the spacing to the last phototransistor is 7.25 μm. Similarly, on the beginning of the next chip, a spacing between phototransistor 150A and 150B is 7.25 μm.

This spacing provides phototransistors at the edge which have the same area as the other phototransistors but, since they are narrower, and closer to the other phototransistors, it maintains the 400 DPI spacing of the array. As can be seen by arrows 152, the spacing from standard phototransistor 150B to the third phototransistor down, 150E, is 187.5 μm. Similarly, the spacing from phototransistor 150Y across the chip boundary to phototransistor 150B as indicated by arrows 154 is 190.5 μm. Thus, the 400 FPI spacing is maintained.

By maintaining the edge phototransistors with the same total area, each array chip will have equal storage capacitance and saturation charge. As shown in FIG. 10, the distance from the last phototransistor, 150Z to the scribe line 156 is 11.5 μm. A typical distance between scribe line 156 and the actual edge of the chip 158 when cut is approximately 7.5 μm. The closest distance between the chips typically achievable is approximately 25 μm.

The affect of the long, narrow phototransistors 150Z and 150A is to pick up a portion light which would hit a normal phototransistor placed there on one side, and by elongating the area of the phototransistor, providing that amount of light over an area corresponding to a standard phototransistor. This provides an approximation of the light value which would fall between the chips.

Figure 11A:
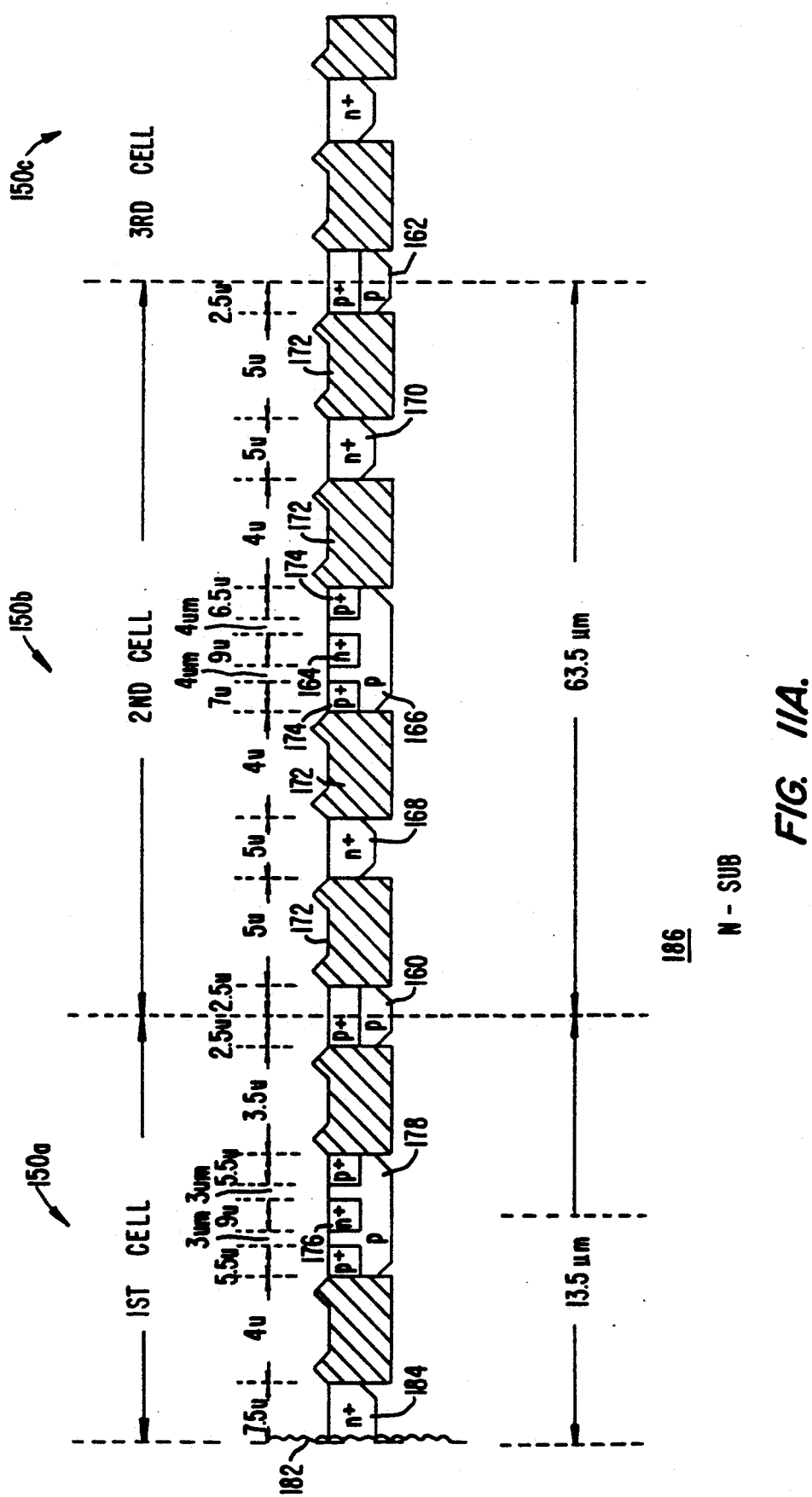
FIG. 11A is a cross-sectional view along lines 11A—11A of FIG. 10.

FIG. 11A shows a cross section along lines 11A—11A of FIG. 10. FIG. 11A shows first cell 150A and second cell 150B of FIG. 10. A channel stop 160 separates the two cells, and a second channel stop 162 separates cell 150B from a third cell 150C. Phototransistor cell 150B has an emitter 164, a base 166 and collectors 168, 170. The base, collectors and channel stops are separated by field oxide regions 172. The base includes a couple of P+ regions 174 which are implemented on the P-base to form an extrinsic base region to eliminate surface state recombination and reduce base resistance to achieve a high gain for the transistor.

Figure 11B:
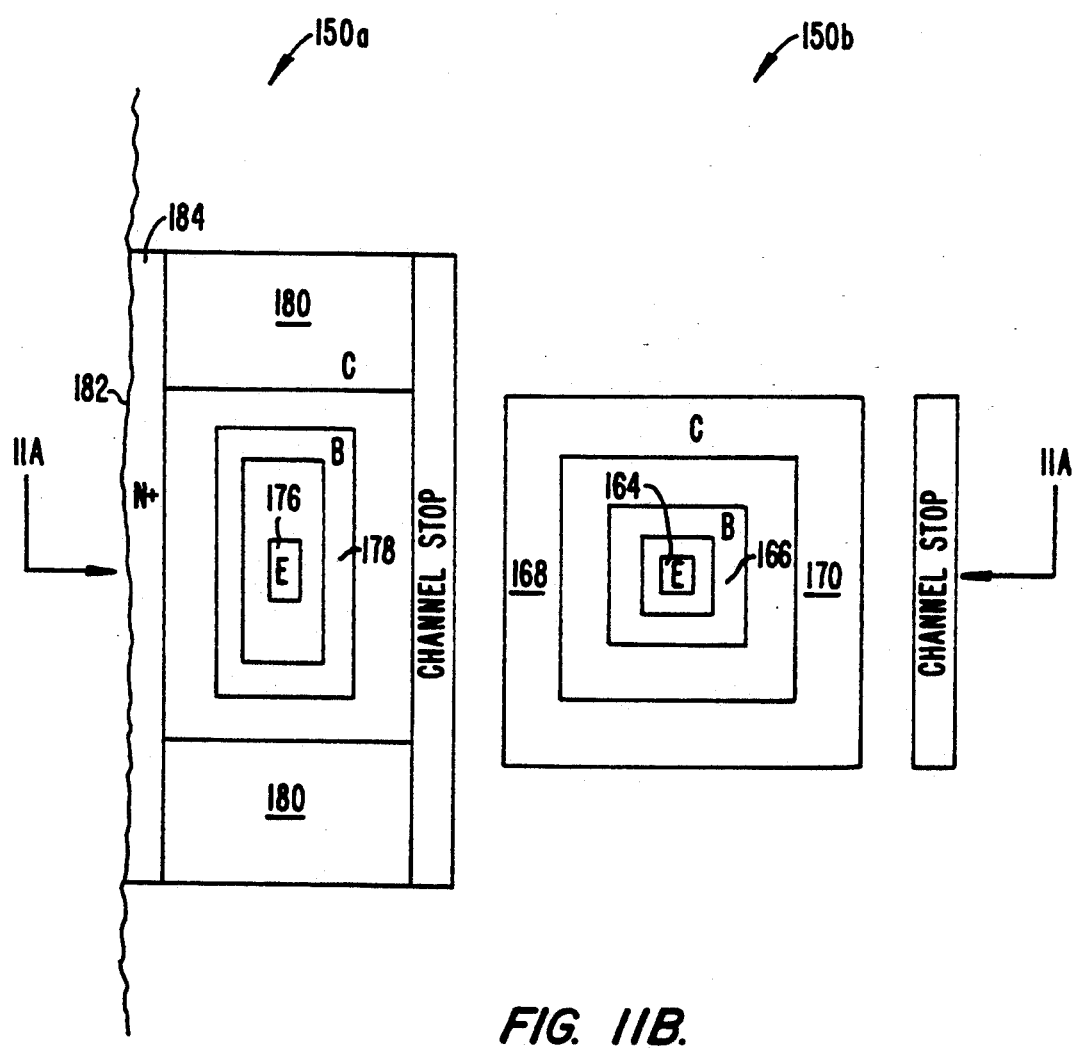
FIG. 11B is a top view of the embodiment of FIG. 11A.

Transistor cell 150A as an emitter 176 and a base 178. As can be seen, there is no collector between the base and channel stop 160. Referring to FIG. 11B, a top view of the structure of 11A is shown. As can be seen, transistor cell 150A has a pair of collector regions which did not show up in the view of 11A along lines 11A—11A of FIG. 11B. This is done to narrow the width of transistor cell 150A and make it closer to transistor cell 150B, as discussed with respective to FIG. 10. The narrow width is compensated for by widening the transistor collector area 180 so that the overall area will be similar to that of transistor cell 150B.

Since the distance from base 178 of transistor cell 158 to chip edge 182 is very short (11.5 μm), there can be problems created by silicon chipping and dust which are created during the wafer sawing operation. Thus, for a photodetector close to the edge, this silicon chipping area and dust can generate a very high dark leakage current. In order to reduce the dark leakage current, an n+ region 184 is implemented on the chip edge. Since the chipping and dust are created on the n+ region 184, the dark leakage current which is generated from the silicon chipping area is absorbed into the N-substrate 186. This n+ region 184 is part of collector region 180.

The light sensitivity of transistor cell 150A would normally be less than that of other pixels of the same size due to the edge effect. Accordingly, the light sensitive area of transistor cell 150 is designed to be approximately 10% larger than that of the other transistor cells so that a uniform light sensitivity will be achieved for all the pixels.

Due to the high gain provided by the transistor structure of FIG. 11A, the charge stored on the storage capacitor associated with each phototransistor can be discharged quickly when the switch connected to that phototransistor is turned on. This allows a clock speed for the present invention of up to 2 Mhz. Thus, the total read out time for 3,456 photodetectors can be shorter than 2 ms.

As can be seen from the structure of FIG. 11A, both the n+ emitter and the P+ implant steps are CMOS compatible processes. Thus, the phototransistor array of the present invention can be manufactured using a standard CMOS process.

FIG. 11A shows for each phototransistor a base region (166, 178) which is formed by a high energy implant to obtain a 0.8 um junction depth. The base concentration at the base-collector junction is about five times higher than that of the base-emitter junction. In other words, the concentration gradient is "negative" compared with that of a conventional planar transistor where the p concentration at the emitter junction is higher than that at the collector junction.

In particular, a p+ (174) region is implemented on the p-base region to form a extrinsic base region of the phototransistor to avoid surface state recombination. The p+ concentration is around $5 \times E20/cm^3$. This is also different from a conventional planar transistor where the concentration is about $1E19/cm^3$.

With this structure, the phototransistor gain, photodiode quantum efficiency and storage capacitance of the present sensor can be optimized.

The emitter n+ region and the aforementioned p+ region can be processed simultaneously at the n+ and p+ source/drain implants steps of a typical CMOS process, thus at least one mask layer can be saved.

Figure 12:
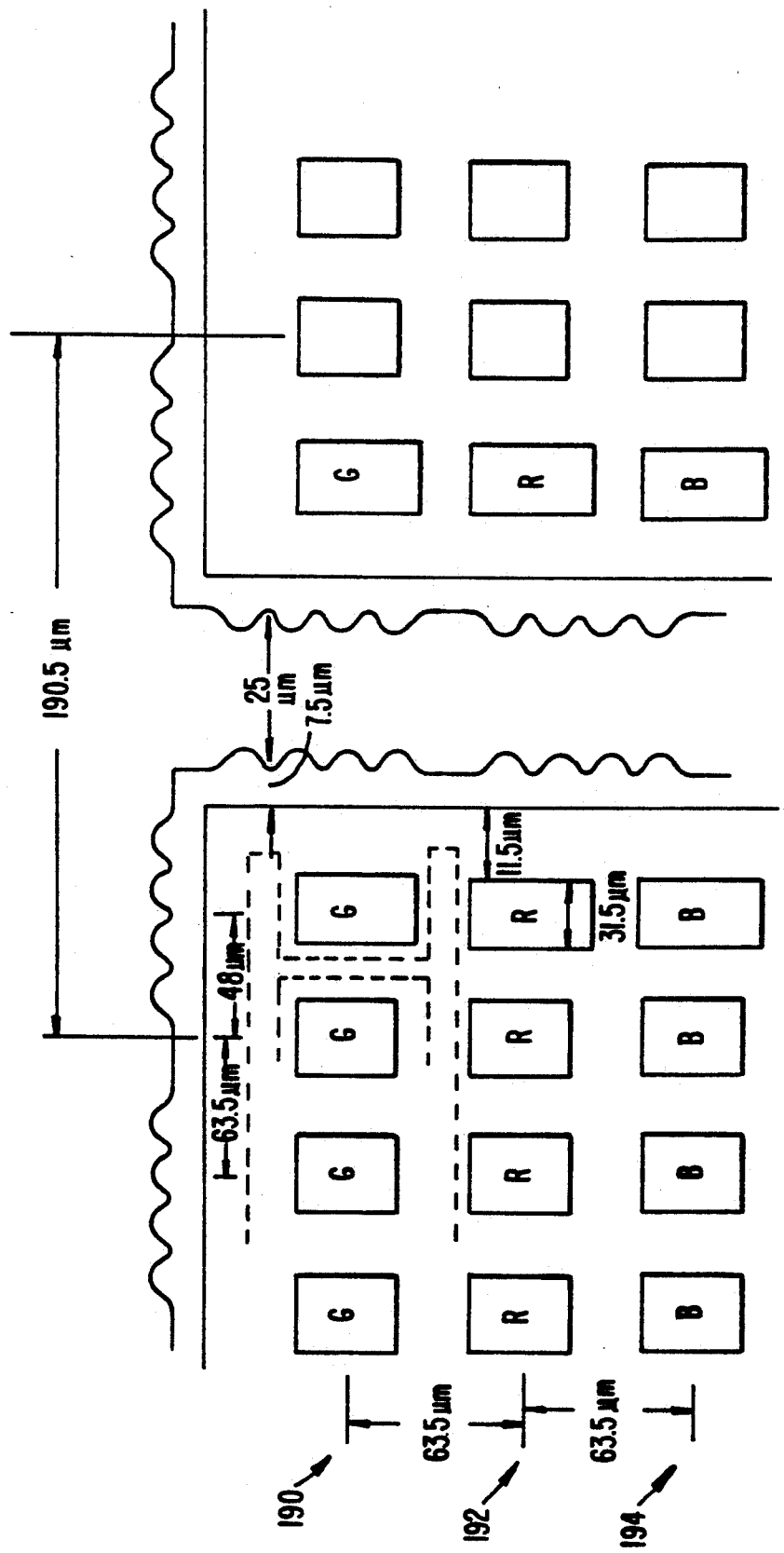
FIG. 12 is a top view of the abutting portions of color array chips according to the present invention.

FIG. 12 shows an embodiment of the present invention for use as a color detector. FIG. 12 shows a portion of two chips similar to the view of FIG. 10. Three rows of photodetectors 190, 192 and 194 are shown corresponding to green, red and blue light, respectively. Each row of photodetectors will have a filter mounted above it to allow through only green, red or blue light, respectively. The individual phototransistors in this embodiment are made more compact since all three rows are needed to scan a single pixel line. Thus, the average phototransistor size is 40 μm by 40 μm, rather than a 50 μm×50 μm size of the gray scale version of FIG. 10. The first and last pixels on the chip, which are longer and narrower, are 31.5 μm by 50 μm, and thus are not as long as those of the embodiment of FIG. 10.

Figure 13:
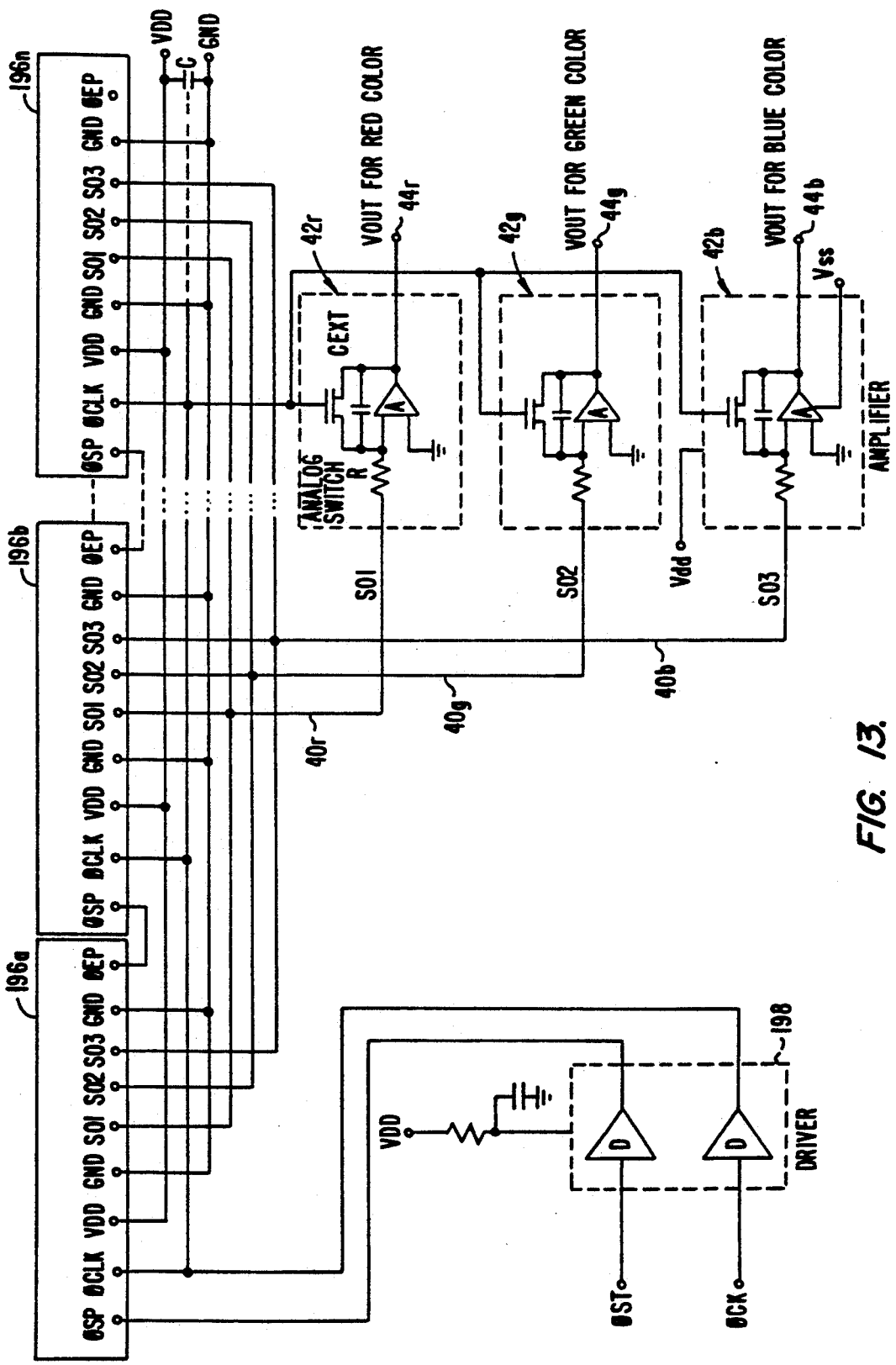
FIG. 13 is a simplified circuit diagram of a color array circuit board.

FIG. 13 is a circuit diagram for the color version of the array chips corresponding to that of FIG. 4 for the gray scale. There is also a single driver circuit 198 similar to driver 32 of FIG. 4. As can be seen, the individual color array chips 196A, 196B, . . . 196N have the same input and output pins as those of FIG. 4. However, there are three output pins 44R, 44G and 44B for the red, green and blue colors respectively. These are provided to three integrator circuits 42R, 42G and 42B, which are all similar to integrator circuit 42 of FIG. 4. Each integrator circuit is coupled to a different one of the three outputs 40R, 40G and 40B of the array chips 196N.

Figure 14:
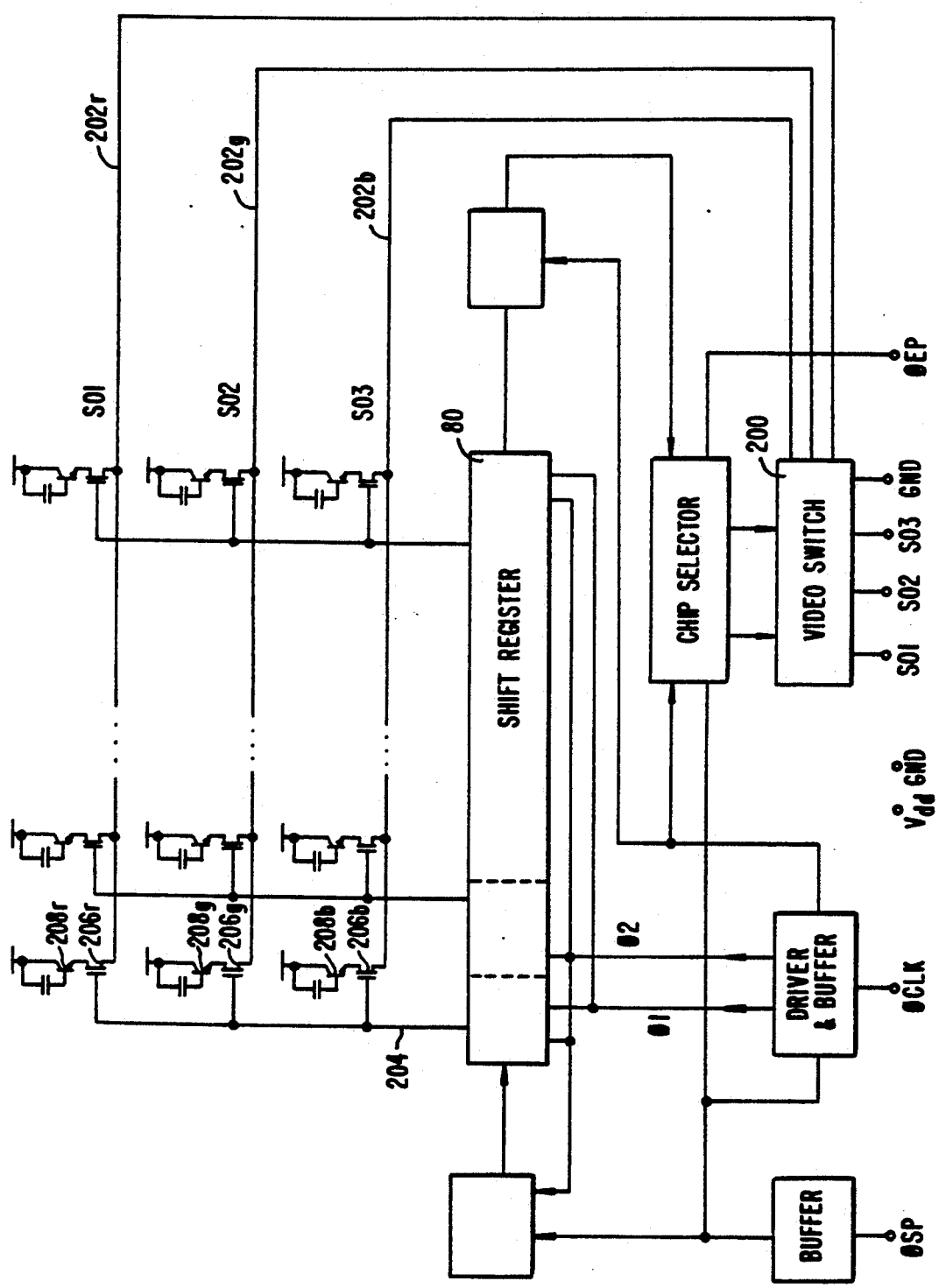
FIG. 14 is a simplified circuit diagram of a color array chip of FIG. 13.

FIG. 14 is a circuit diagram for the color detector chips corresponding to the circuit diagram of FIG. 6 for the gray scale chips. The circuitry is the same except that video switch 200 is connected to 3 read lines, 202B, 202G and 202R, corresponding to the blue, green and red photodetector, respectively. Shift register 80 is the same as in FIG. 6. However, each shift register output is coupled to switches for three phototransistors in parallel.

For instance, for the first output line 204 of shift register 80, it is coupled to switches 206B, 206G and 206R. Each of these switches is activated at the same time to connect phototransistors 208B, 208G and 208R to read lines 202B, 202G and 202R, respectively, at the same time.

Figure 1:
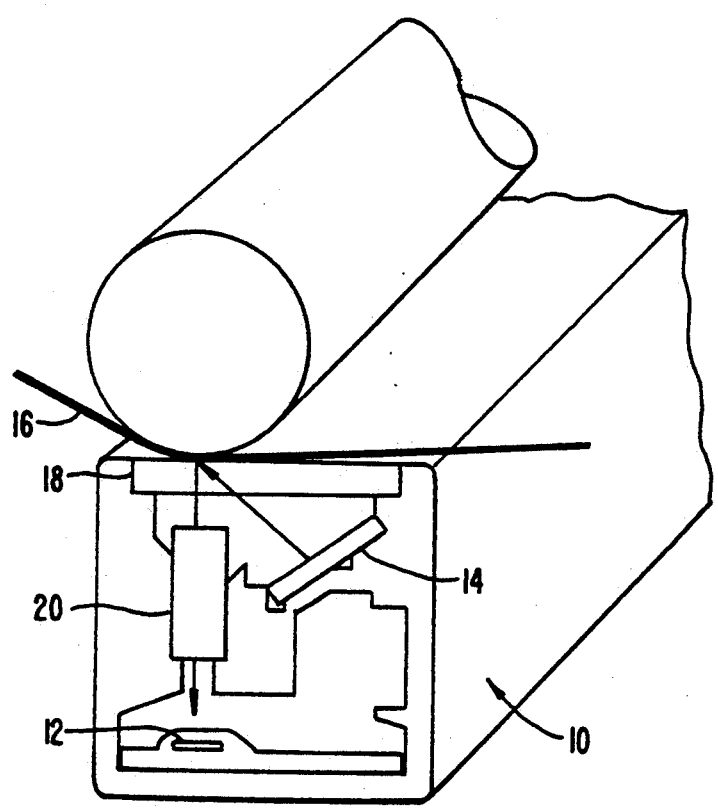
FIG. 1 is a diagram of a prior art CIS sensor in a facsimile application.
Figure 2:
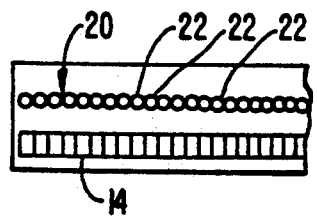
FIG. 2 is a top view of the rod lens array of FIG. 1.
Figure 3:
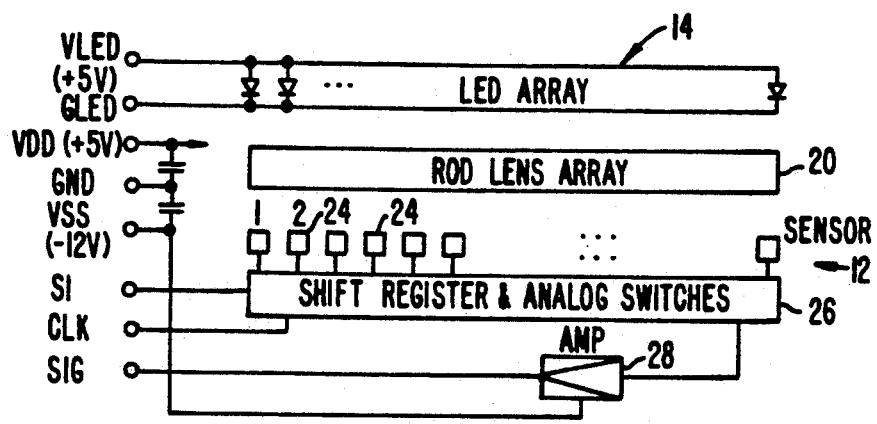
FIG. 3 is a diagram of the electronic circuitry of the prior art sensor module of FIG. 1.
Figure 15:
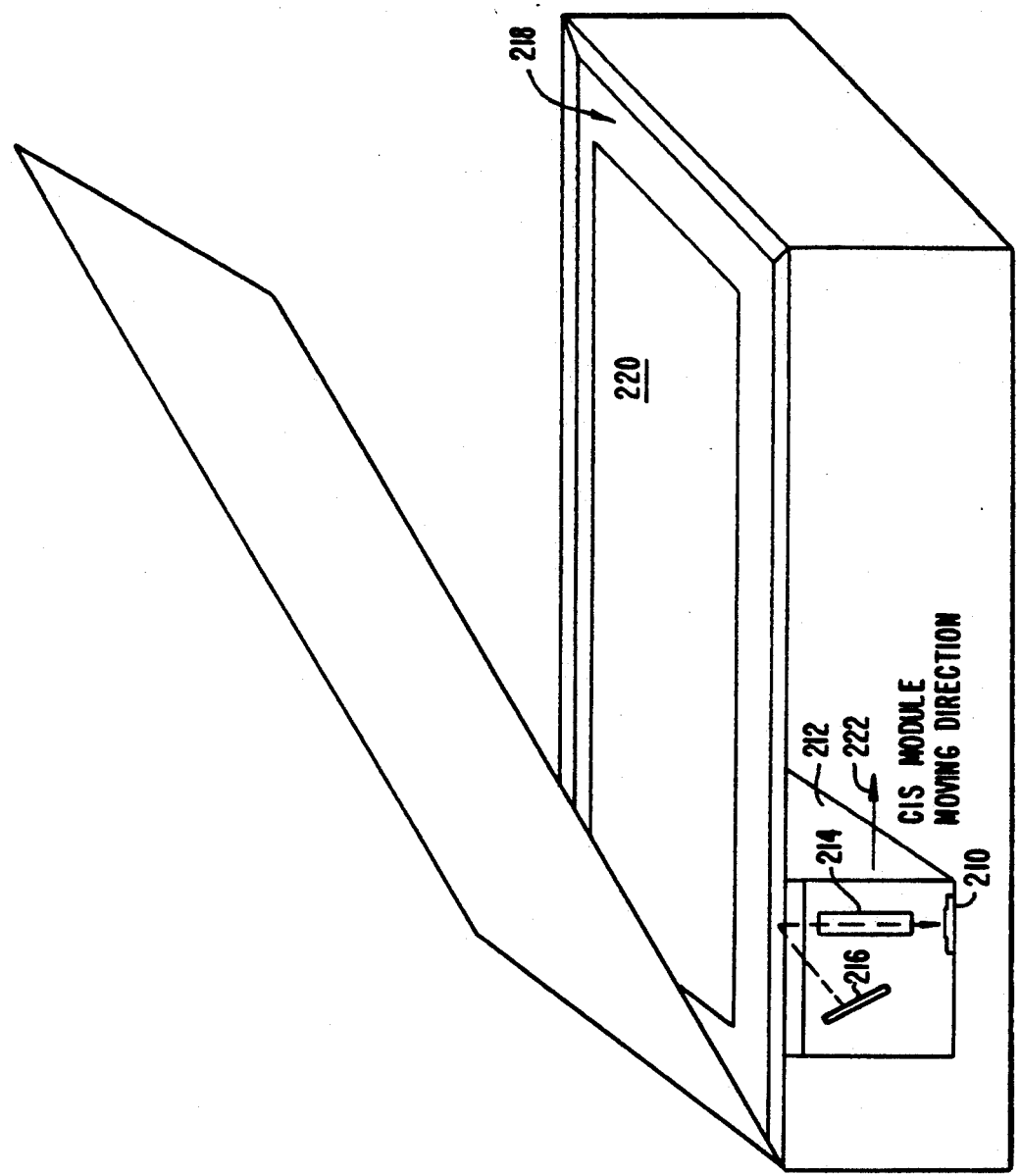
FIG. 15 is a diagram of a CIS module according to the present invention in a photocopier.

FIG. 15 shows a photodetector array circuit 210 according to the present invention mounted in a module 212. A rod lens array 214 and a LED array 216 are also included. The LED array and the rod lens array can be similar to that shown in FIG. 1 of the prior art. The module is mounted in a fixed, full page scanner which has a glass window 218 on top, onto which a piece of paper 220 can be placed. The module 212 is then moved by a motor in the direction of arrow 222.

Figure 16:
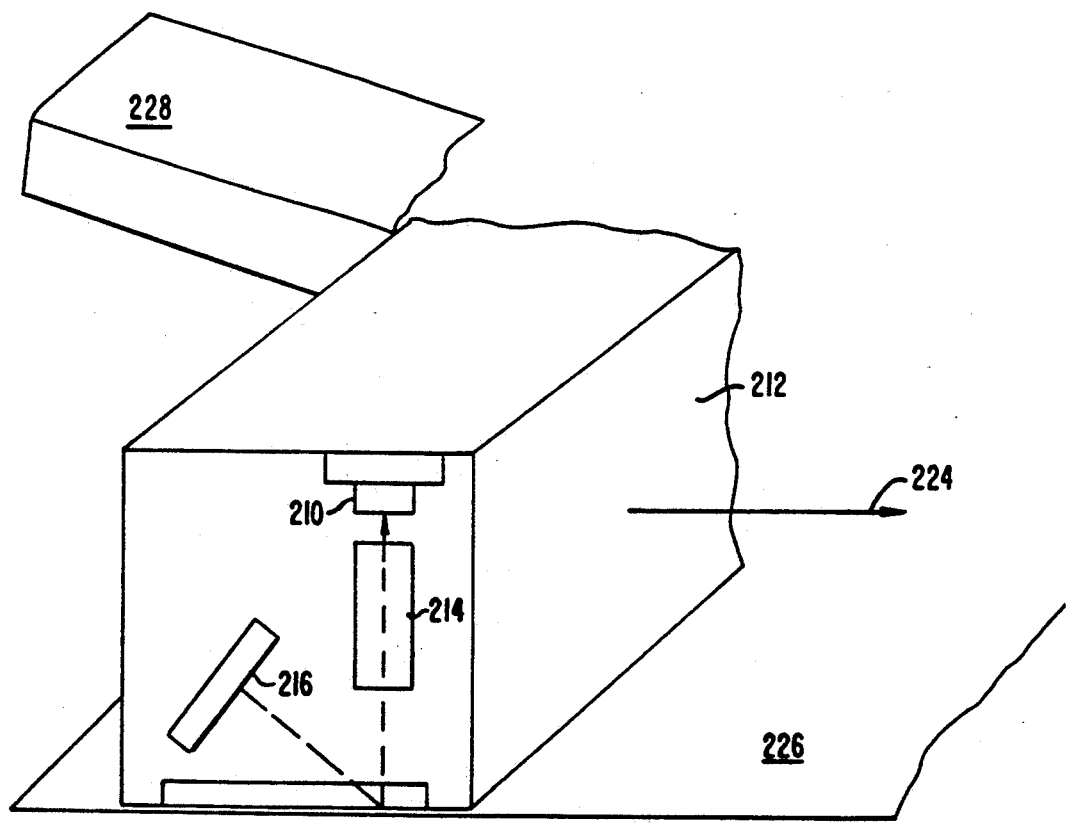
FIG. 16 is a diagram illustrating the use of a CIS module according to the present invention in a handheld scanner.

FIG. 16 shows module 212 of FIG. 15 mounted in a hand held scanner which is moved in a direction indicated by an arrow 224 across a fixed piece of paper 226. A handle 228 is connected to module 212 for easy grasping and moving it along the page.

As will be understood by those familiar with the art, the present invention may be embodied in other specific forms without departing from the spirit or essential characteristics thereof. For example, a different number of transistors could be used for each stage of the two phase shift register of the present invention. Accordingly, the disclosure of the preferred embodiment of the invention is intended to be illustrative, but not limiting, of the scope of the invention which is set forth in the following claims.

What is claimed is:

1. A photosensor array circuit comprising:
   an array of photosensors;
   an output line;
   a plurality of switches, each switch being coupled between one of said photosensors and said output line; and
   a shift register having a plurality of outputs, each of said outputs being coupled to a control input of one of said switches;
   said shift register having two clock inputs for two phases of a clock signal with each successive output of said shift register being clocked by alternate ones of said phases such that two of said shift register outputs are clocked in each clock cycle.

2. The photosensor array circuit of claim 1 further comprising a dummy shift register stage coupled to an input of said shift register, said stage having means for storing and shifting in and out a bit of data.

3. The photosensor array circuit of claim 1 further comprising a dummy shift register stage coupled to a last output of said shift register, said stage having means for storing and shifting in and out a bit of data.

4. The photosensor array circuit of claim 1 further comprising:
   an integrator circuit coupled between said output line and an output terminal of a chip containing said photosensor array circuit.

5. The photosensor array circuit of claim 4 wherein said integrator circuit comprises:
   an amplifier having an inverting input coupled to said output line, an output coupled to said output terminal;
   a capacitor coupled between said inverting input and said output terminal; and
   a switch coupled across said capacitor and having a control input coupled to a clock signal.

6. The photosensor array circuit of claim 1 further comprising a clock driver circuit having an input coupled to a clock input terminal and having first an second outputs for providing first and second phases of a clock signal from said clock input terminal to said shift register.

7. The photosensor array circuit of claim 1 wherein said shift register comprises:
   a plurality of stages, each stage including a first inverter and a second inverter, said second inverter in alternating stages being clocked by a first phase of said clock, and said second inverter in the remaining stages being clocked by a second phase of said clock; and
   a plurality of transmission gates, each being between two of said stages.

8. The photosensor array circuit of claim 7 wherein said second inverter comprises a PMOS and an NMOS transistor coupled between two voltage levels, with a drain of one of said transistors being coupled to one of said clock signals.

9. A photosensor array circuit comprising:
   an array of photosensors;
   an output line;
   a plurality of switches, each switch being coupled between one of said photosensors and said output line;
   a shift register having a plurality of outputs, each of said outputs being coupled to a control input of one of said switches;
   said shift register having two clock inputs for two phases of a clock signal with each successive output of said shift register being clocked by alternate ones of said phases such that two of said shift register outputs are clocked in each clock cycle;
   a video switch coupling said output line to an output terminal of a chip containing said photosensor array circuit; and
   a chip selector circuit having a first input coupled to a start signal terminal of said chip, a second input coupled to a last output of said shift register, a first output coupled to a control input of said video switch and a second output coupled to an output terminal of said chip, said chip selector being operative to couple said output line to said output terminal between said start signal and a signal from said last output of said shift register.

10. A photosensor array circuit comprising:

an array of photosensors;
an output line;
a plurality of switches, each switch being coupled between one of said photosensors and said output line; and
a shift register having a plurality of outputs, each of said outputs being coupled to a control input of one of said switches;
said shift register having two clock inputs for two phases of a clock signal with each successive output of said shift register being clocked by alternate ones of said phases such that two of said shift register outputs are clocked in each clock cycle;
wherein a first and last photosensor in said array are narrower than the remaining photosensors and longer than said remaining photosensors.

11. The photosensor array circuit of claim 10 wherein said photosensors are bipolar phototransistors and a base of said first and last photosensors is reduced in an area in line with said remaining photosensors and is enlarged in an area orthogonal to said line.

12. The photosensor array circuit of claim 11 wherein each of said bipolar phototransistors has an n+ emitter region and an extrinsic p+ base region, on top of an intrinsic p base region, which are formed at the same time as the n+ source regions and p+ drain regions, respectively, of CMOS transistors of said shift register.

13. The photosensor array circuit of claim 10 wherein a photosensitive area of said first and last photosensors is larger than a photosensitive area of said remaining photosensors to compensate for edge effects.

14. The photosensor array circuit of claim 10 wherein each said photosensor is a transistor having a base concentration which is greater at a base-collector junction than at a base-emitter junction.

15. The photosensor array circuit of claim 10 wherein said base concentration at said base-collector junction is approximately 5 times greater than the base concentration at said base-emitter junction.

16. A photosensor array circuit comprising:
an array of photosensors;
an output line;
a plurality of switches, each switch being coupled between one of said photosensors and said output line; and
a shift register having a plurality of outputs, each of said outputs being coupled to a control input of one of said switches;
said shift register having two clock inputs for two phases of a clock signal with each successive output of said shift register being clocked by alternate ones of said phases such that two of said shift register outputs are clocked in each clock cycle, wherein said shift register further includes
a plurality of first stages, each first stage including
a first PMOS and a first NMOS transistor coupled in series with said NMOS transistor being coupled to ground, a gate of said NMOS transistor being coupled to a previous stage and a gate of said PMOS transistor being coupled to a first phase of said clock,
a second PMOS and a second NMOS transistor coupled in series, with a gate of said second NMOS transistor being coupled to a second phase of said clock, a gate of said second PMOS transistor being coupled to a junction of said first PMOS and NMOS transistors, a drain of said second PMOS transistor being coupled to said first phase of said clock signal and a junction of said second PMOS and NMOS transistors being an output of said stage; and
a plurality of second stages, each second stage being between two of said first stages, said second stages being identical to said first stages except that said connections to said first and second phase of said clock are reversed.

17. A photosensor array circuit comprising:
an array of photosensors;
an output line;
a plurality of switches, each switch being coupled between one of said photosensors and said output line; and
a shift register having a plurality of outputs, each of said outputs being coupled to a control input of one of said switches;
said shift register having two clock inputs for two phases of a clock signal with each successive output of said shift register being clocked by alternate ones of said phases such that two of said shift register outputs are clocked in each clock cycle, wherein said shift register includes
a plurality of first stages, each first stage including
a first PMOS and a first NMOS transistor coupled in series with said NMOS transistor being coupled to ground, a gate of said NMOS transistor being coupled to a previous stage and a gate of said second PMOS transistor being coupled to a first phase of said clock,
a second PMOS and a second NMOS transistor coupled in series, with a gate of said second NMOS transistor and a gate of said second PMOS transistor being coupled to a junction of said first PMOS and NMOS transistors, a drain of said PMOS transistor being coupled to said first phase of said clock signal and a junction of said second PMOS and NMOS transistors being an output of said stage; and
a plurality of second stages, each second stage being between two of said first stages, said second stages being identical to said first stages except that said connections to said first and second phase of said clock are reversed.

* * * * *